(12) United States Patent
Hong et al.

(10) Patent No.: US 12,308,232 B2
(45) Date of Patent: May 20, 2025

(54) EPITAXIAL GROWTH METHOD FOR FDSOI HYBRID REGION

(71) Applicant: Shanghai Huali Integrated Circuit Corporation, Shanghai (CN)

(72) Inventors: Jiaqi Hong, Shanghai (CN); Qiang Yan, Shanghai (CN); Jun Tan, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 68 days.

(21) Appl. No.: 18/450,937

(22) Filed: Aug. 16, 2023

(65) Prior Publication Data

US 2024/0170287 A1 May 23, 2024

(30) Foreign Application Priority Data

Nov. 18, 2022 (CN) .......................... 202211443459.X

(51) Int. Cl.
*H01L 21/02* (2006.01)
*H10D 84/01* (2025.01)
*H10D 84/03* (2025.01)

(52) U.S. Cl.
CPC .. *H01L 21/02639* (2013.01); *H01L 21/02532* (2013.01); *H10D 84/0167* (2025.01); *H10D 84/038* (2025.01)

(58) Field of Classification Search
CPC ........... H01L 21/7624; H01L 21/76272; H01L 21/02494; H01L 21/02488; H01L 21/02381; H01L 21/02532; H01L 21/02639; H01L 27/1207; H01L 21/7624; H01L 21/02647; H01L 21/02587; H01L 21/0243; H01L 21/02631; H01L 21/02634; H01L 21/02636; H01L 21/02293; H01L 21/823807; H01L 21/02502; H01L 21/02516; H01L 21/02609; H01L 21/76248; H01L 29/165; C30B 25/18; H10D 84/0167; H10D 84/038
See application file for complete search history.

(56) References Cited

U.S. PATENT DOCUMENTS 8,173,551 B2 * 5/2012 Bai .................. H01L 21/02433
438/758
9,508,799 B2 * 11/2016 Weng .................. H01L 29/1054
(Continued)

*Primary Examiner* — Julio J Maldonado
*Assistant Examiner* — Nathan Pridemore
(74) *Attorney, Agent, or Firm* — Banner & Witcoff, Ltd.

(57) ABSTRACT

The present application discloses an epitaxial growth method for an FDSOI hybrid region, comprising: step 1, providing an FDSOI substrate structure; step 2, forming a trench; step 3, performing first isotropic epitaxial growth, wherein a top surface of a first semiconductor epitaxial sublayer is located in a plane between a top surface and a bottom surface of a dielectric buried layer, and a second semiconductor epitaxial sublayer comprise a lateral protruding structure on the side face of the semiconductor top layer; and step 4, performing second epitaxial growth having a growth rate of the first crystalline face, which is greater than a growth rate of the second crystalline face, wherein the third semiconductor epitaxial sublayer has a chamfered recess near the side face of the semiconductor top layer, finally the lateral protruding structure is located in the chamfered recess.

15 Claims, 4 Drawing Sheets

(56) References Cited

U.S. PATENT DOCUMENTS 11,063,139 B2 * 7/2021 Jain ................... H01L 29/045
2011/0272789 A1 * 11/2011 Wang ............... H01L 21/02532
257/618

* cited by examiner

Step 1. An FDSOI substrate structure having a hybrid region is provided.

Step 2. A trench is formed, wherein the second top surface of the semiconductor body layer comprises a first crystalline face of the semiconductor top layer, and wherein a side face of the semiconductor top layer comprises a second crystalline face of the semiconductor top layer.

Step 3. First isotropic epitaxial growth is performed, wherein a top surface of the first semiconductor epitaxial sublayer is located in a place between a top surface and a bottom surface of the dielectric buried layer, and the second semiconductor epitaxial sublayer comprises a lateral protruding structure on the side face of the semiconductor top layer.

Step 4. Second epitaxial growth is an anisotropic epitaxial growth having a growth rate of the first crystalline face, wherein the growth rate of the first crystalline face is greater than a growth rate of the second crystalline face, wherein the third semiconductor epitaxial sublayer comprises a chamfered recess at the side face of the semiconductor top layer, as a result of the growth rate of the first crystalline face being faster than the growth rate of the second crystalline face, and the lateral protruding structure and the chamfered recess overlap on the side face of the semiconductor top layer.

FIG. 2

EPITAXIAL GROWTH METHOD FOR FDSOI HYBRID REGION

CROSS-REFERENCES TO RELATED APPLICATIONS

This application claims the priority to Chinese patent application No. 202211443459.X, filed on Nov. 18, 2022, and entitled "EPITAXIAL GROWTH METHOD FOR FDSOI HYBRID REGION", the disclosure of which is incorporated herein by reference in entirety.

TECHNICAL FIELD

The present application relates to methods for manufacturing semiconductor integrated circuits, in particular to an epitaxial growth method for a fully depleted semiconductor on insulator (FDSOI) hybrid region.

BACKGROUND

With rapid and continuous development of integrated circuits (IC) manufacturing technologies, critical dimension of IC devices in the circuits shrinks continuously, thus the corresponding thin film thickness of the constituent components also decreases continuously. The FDSOI device has become a choice to overcome device short channel effect. The industry has imposed increasingly more stringent defect requirements the manufacturing process, ultimately a zero defect tolerance is desired.

In a FDSOI process, a substrate structure includes a semiconductor body layer, a dielectric buried layer, and a semiconductor top layer. The dielectric buried layer is formed on the surface of the semiconductor body layer, and the semiconductor top layer is formed on the surface of the dielectric buried layer. Typically, the materials of the semiconductor body layer and the semiconductor top layer are Si. The semiconductor top layer is typically referred to as the SOI layer. The semiconductor top layer has some ultra-thin structures. An ultra-thin transistor can be obtained by using the ultra-thin semiconductor top layer to form a semiconductor device, effectively controlling the short channel effect of the transistor and thereby reducing a power supply voltage.

In the FDSOI process, in addition to the formation of the ultra-thin transistor, such as a CMOS device, in the semiconductor top layer, the formation of a passive device and a pickup structure that are in contact with the bottom semiconductor body layer is also required in some cases. In order to form the passive device and pickup structure that are in contact with the bottom semiconductor body layer, it is necessary to form semiconductor epitaxial silicon in the FDSOI, which is in direct contact with the bottom semiconductor body layer and has a top surface flush with a top surface of the semiconductor top layer, in which case a hybrid region needs to be defined separately to form a semiconductor epitaxial layer in direct contact with the semiconductor body layer. In an existing epitaxial growth method for an FDSOI hybrid region, due to inherent properties of an epitaxial process, such as silicon epitaxy, the semiconductor top layer in the hybrid region and on the periphery of an SOI region outside the hybrid region may also generate additional epitaxy during the growth of semiconductor epitaxy, resulting in interference with a growth mode of the semiconductor epitaxial layer in the hybrid region and ultimately forming a protrusion defect on the periphery. Such defect can be alleviated to an acceptable level by improving the growth process, but cannot be completely eliminated.

FIGS. 1A-1D are schematic diagrams of a device structure obtained after each step in the existing epitaxial growth method for an FDSOI hybrid region. The existing epitaxial growth method for an FDSOI hybrid region includes the following steps:

Step 1. An FDSOI substrate structure is provided, wherein the FDSOI substrate structure includes a semiconductor body layer 101, a dielectric buried layer 102, and a semiconductor top layer 103, the dielectric buried layer 102 is formed on a surface of the semiconductor body layer 101, and the semiconductor top layer 103 is formed on a surface of the dielectric buried layer 102.

Referring to FIG. 1B, a hard mask layer 104 is formed on a surface of the semiconductor top layer 103.

Typically, the materials of the semiconductor body layer 101 and the semiconductor top layer 103 are both silicon. The material of the dielectric buried layer 102 is silicon oxide.

The hard mask layer 104 is formed by stacking a silicon oxide layer and a silicon nitride layer. A hybrid region is formed.

Step 2. Referring to FIG. 1B, a trench 105 is formed in the hybrid region by means of a lithography definition and an etching process, wherein the hard mask layer 104, semiconductor top layer 103, and the dielectric buried layer 102 in the trench 105 are removed, a bottom surface of the trench 105 exposes a top surface of the semiconductor body layer 101, and a side face of the trench 105 exposes a side face of the hard mask layer 104, a side face of the semiconductor top layer 103, a side face of the dielectric buried layer 102, and a side face of the semiconductor body layer 101 that are within the depth range of the trench 105.

Step 3. Referring to FIG. 1D, epitaxial growth is performed to form a semiconductor epitaxial layer 106, wherein the semiconductor epitaxial layer 106 fills the trench 105, and the epitaxial growth ends when a top surface of the semiconductor epitaxial layer 106 is flush with a top surface of the semiconductor top layer 103.

The epitaxial growth is a continuous growth process. Referring to FIG. 1C, which is a schematic diagram of a device structure obtained at a moment in the middle of the epitaxial growth, it can be seen that a top surface of a semiconductor epitaxial sublayer 1061 is below a top surface of the dielectric buried layer 102. However, a semiconductor epitaxial sublayer 1062 is also grown from a side face of the semiconductor top layer 103, and it can be seen that the semiconductor epitaxial sublayer presents a lateral protruding structure 1062.

As the epitaxial growth continues, the semiconductor epitaxial sublayer 1061 is thickened continuously, ultimately forming a protrusion defect 1063 at a corner of an overlap region between the semiconductor epitaxial sublayers 1061 and 1062.

BRIEF SUMMARY

According to some embodiments in this application, an epitaxial growth method for an FDSOI hybrid region provided by the present application includes the following steps:

step 1, providing an FDSOI substrate structure, wherein the FDSOI substrate structure includes a semiconductor body layer, a dielectric buried layer, and a semiconductor top layer, the dielectric buried layer is formed on a surface of the semiconductor body layer, the semiconductor top layer is formed on a surface of the dielectric buried layer; and a hard mask layer is formed on a surface of the semiconductor top layer;

step 2, forming a trench in the entire hybrid region, wherein the hard mask layer, the semiconductor top layer, and the dielectric buried layer in the trench are fully removed, a bottom surface of the trench is flush with a top surface of the semiconductor body layer or the bottom surface of the trench is located below the top surface of the semiconductor body layer, the bottom surface of the trench exposes a surface of the semiconductor body layer, and the surface of the semiconductor body layer exposed by the bottom surface of the trench is a second top surface; a side face of the trench exposes the hard mask layer, the semiconductor top layer, the dielectric buried layer, and a side face of the semiconductor body layer that are within a depth range of the trench;

the second top surface of the semiconductor body layer is a first crystalline face, and a side face of the semiconductor top layer has a second crystalline face;

step 3, performing first epitaxial growth, wherein the first epitaxial growth is isotropic epitaxial growth having the same growth rate of both the first plane and the secondcrystalline face;

the first epitaxial growth forms a first semiconductor epitaxial sublayer on the second top surface of the semiconductor body layer, and a top surface of the first semiconductor epitaxial sublayer is located between a top surface and a bottom surface of the dielectric buried layer; and the first epitaxial growth forms a second semiconductor epitaxial sublayer on the side face of the semiconductor top layer during the same period as the first epitaxial growth occurs, and the second semiconductor epitaxial sublayer forms a lateral protruding structure on the side face of the semiconductor top layer; and step 4, performing second epitaxial growth, wherein the second epitaxial growth is anisotropic epitaxial growth having a growth rate of the first crystalline face. herein the growth rate of the first crystalline face is greater than a growth rate of the second crystalline face;

the second epitaxial growth forms a third semiconductor epitaxial sublayer on the top surface of the first semiconductor epitaxial sublayer, and a top surface of the third semiconductor epitaxial sublayer is flush with a top surface of the semiconductor top layer;

using the characteristic of the growth rate of the second crystalline face being less than the growth rate of the first crystalline face, the third semiconductor epitaxial sublayer forms a chamfered recess near the side face of the semiconductor top layer; and a semiconductor epitaxial layer is formed by stacking the first semiconductor epitaxial sublayer, the second semiconductor epitaxial sublayer, and the third semiconductor epitaxial sublayer, and positions of the lateral protruding structure and the chamfered recess overlap, such that the semiconductor epitaxial layer has a flat surface at the side surface of the semiconductor top layer.

In some cases, the material of the semiconductor body layer includes silicon or germanium.

In some cases, the material of the dielectric buried layer includes silicon oxide or a high dielectric constant material.

In some cases, the material of the semiconductor top layer includes silicon or germanium.

In some cases, the material of the semiconductor epitaxial layer includes silicon or germanium.

In some cases, the hard mask layer is formed by stacking a first silicon oxide layer and a second silicon nitride layer.

In some cases, in step 2, the hybrid region is defined by means of a lithography process, the trench is formed by means of an etching process, the etching process of the trench fully removes the hard mask layer, the semiconductor top layer, and the dielectric buried layer in the hybrid region, and the etching process of the trench does not etch or partially etch the semiconductor body layer.

In some cases, the thickness of semiconductor top layer is less than 12 nm.

In some cases, the first crystalline face is a plane (100), and the second crystalline face is a plane (110).

In some cases, the top surface of the first semiconductor epitaxial sublayer is flush with a surface at about two-thirds of the thickness of the dielectric buried layer.

In some cases, a temperature of the second epitaxial growth is greater than a temperature of the first epitaxial growth;

a pressure of the second epitaxial growth is greater than a pressure of the first epitaxial growth; and an etching gas ratio of the second epitaxial growth is greater than an etching gas ratio of the first epitaxial growth.

In some cases, in step 4, the ratio of the growth rate of the first crystalline face to the growth rate of the second crystalline face is a first growth rate ratio, the first growth rate ratio is optimized by adjusting the temperature, pressure, or etching gas ratio of the second epitaxial growth, the first growth rate ratio is larger when the temperature of the second epitaxial growth is higher, the first growth rate ratio is larger when the pressure of the second epitaxial growth is higher, and the first growth rate ratio is larger when the etching gas ratio of the second epitaxial growth is higher.

In some cases, a surface of the semiconductor epitaxial layer in the hybrid region supports a passive device or a pickup structure that needs to be connected to the semiconductor body layer.

In some cases, the semiconductor top layer outside the hybrid region supports a CMOS device.

In some cases, the CMOS device includes a PMOS device and an NMOS device.

In the present application, after the formation of the trench of the hybrid region, using the characteristic of the second crystalline face on the side face of the semiconductor top layer exposed from the side face of the trench being different from the first crystalline face of the second top surface of the semiconductor body layer exposed from the bottom surface of the trench, the formation of the semiconductor epitaxial layer of the hybrid region is divided into two times of epitaxial growth. The first epitaxial growth is the same as epitaxial growth of the semiconductor epitaxial layer of the hybrid region in the existing process. Although the second semiconductor epitaxial sublayer presenting the lateral protruding structure is also formed on the side face of the semiconductor top layer, the present application re-defines the thickness of the grown first semiconductor epitaxial sublayer, such that the top surface of the first semiconductor epitaxial sublayer is located between the top surface and the bottom surface of the dielectric buried layer. Meanwhile, the second epitaxial growth is configured as the anisotropic epitaxial growth having the growth rate of the first crystalline face, herein the growth rate of the first crystalline face is greater than the growth rate of the second crystalline face. In this way, the second epitaxial growth forms the chamfered recess on the side face of the semiconductor top layer. After stacking of all the semiconductor epitaxial sublayers, the lateral protruding structure and chamfered recess are exactly in the same position region. As such, the lateral protruding structure precisely fills the chamfered recess, thus avoiding both a recess defect caused by the chamfered recess and an upper protrusion defect generated by the lateral protruding structure. Finally, the semiconductor epitaxial layer may have a flat surface on the side face of the semiconductor top layer, i.e. on the periphery of the hybrid region. Therefore, the present application can eliminate the protrusion defect in the semiconductor epitaxial layer on the periphery of the hybrid region to improve the surface flatness of the semiconductor epitaxial layer in the hybrid region.

BRIEF DESCRIPTION OF THE DRAWINGS

The present application will be further described in detail below with reference to the drawings and specific implementations:

FIG. 2 is a flowchart of an epitaxial growth method for an FDSOI hybrid region according to an embodiment of the present application.

DETAILED DESCRIPTION OF THE DISCLOSURE

Figure 1A:
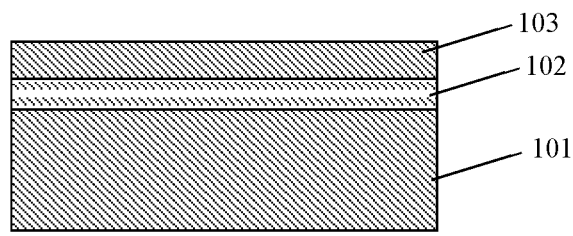
FIGS. 1A-1D are schematic diagrams of device structures obtained after each step in an existing epitaxial growth method for an FDSOI hybrid region.
Figure 1B:
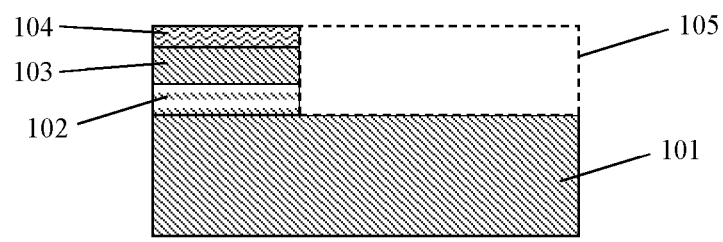
Figure 1C:
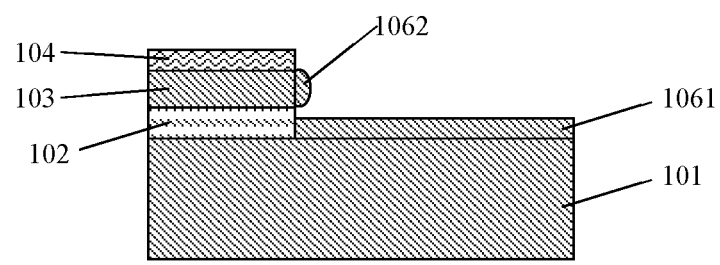
Figure 1D:
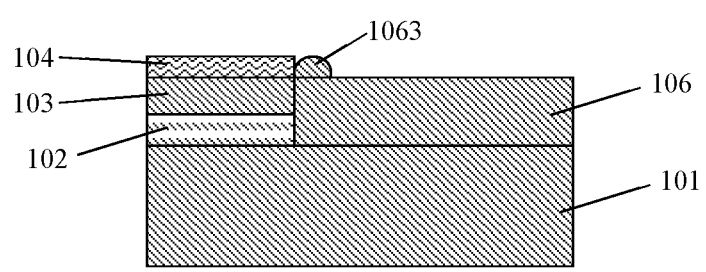
Figure 3A:
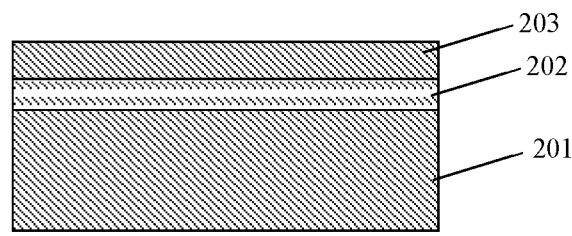
FIGS. 3A-3E are schematic diagrams of the device structures obtained after each step in the epitaxial growth method for an FDSOI hybrid region according to an embodiment of the present application.

FIG. 2 is the flowchart of an epitaxial growth method for an FDSOI hybrid region according to this embodiment of the present application. FIGS. 3A-3E are schematic diagrams of device structures obtained after each step of the epitaxial growth method for the FDSOI hybrid region according to this embodiment of the present application. The epitaxial growth method for the FDSOI hybrid region according to this embodiment of the present application includes the following steps:

Step 1. Referring to FIG. 3A, an FDSOI substrate structure is provided, wherein the FDSOI substrate structure includes a semiconductor body layer 201, a dielectric buried layer 202, and a semiconductor top layer 203, herein the dielectric buried layer 202 is formed on a surface of the semiconductor body layer 201, and the semiconductor top layer 203 is formed on a surface of the dielectric buried layer 202.

Figure 3B:
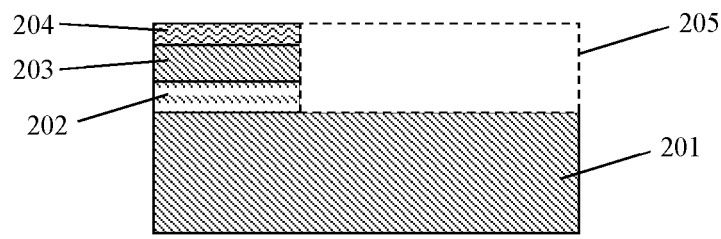

Referring to FIG. 3B, a hard mask layer 204 is formed on a surface of the semiconductor top layer 203.

In the method according to this embodiment of the present application, the material of the semiconductor body layer 201 includes silicon or germanium.

The material of the dielectric buried layer 202 includes silicon oxide or a high dielectric constant material.

The material of the semiconductor top layer 203 includes silicon or germanium.

The thickness of semiconductor top layer 203 is less than 12 nm.

The hard mask layer 204 is formed by stacking a first silicon oxide layer and a second silicon nitride layer.

Step 2. Referring to FIG. 3B, a trench 205 is formed in the hybrid region, wherein the hard mask layer 204, the semiconductor top layer 203, and the dielectric buried layer 202 in the trench 205 are removed, a bottom surface of the trench 205 is flush with or below the bottom surface of the dielectric buried layer 202. The bottom surface of the trench 205 exposes a surface of the semiconductor body layer 201, and the surface of the semiconductor body layer 201 exposed by the bottom surface of the trench 205 is a second top surface of the crystalline structure of the semiconductor body; a side face of the trench 205 exposes a side face of the hard mask layer 204, a side face of the semiconductor top layer 203, a side face of the dielectric buried layer 202, and a side face of the semiconductor body layer 201 that are within a depth range of the trench 205.

The second top surface of the semiconductor body layer 201 has the first crystalline face of the semiconductor structure lattice, and the side face of the semiconductor top layer 203 has the second crystalline face of the semiconductor structure lattice.

In the method according to this embodiment of the present application, the boundaries of the hybrid region are defined by means of a lithography process, the trench 205 is then patterned by means of an etching process, the etching process of the trench 205 removes the hard mask layer 204, the semiconductor top layer 203, and the dielectric buried layer 202 in the hybrid region, herein the patterning process of the trench 205 does not remove the semiconductor body layer 201.

Figure 3C:
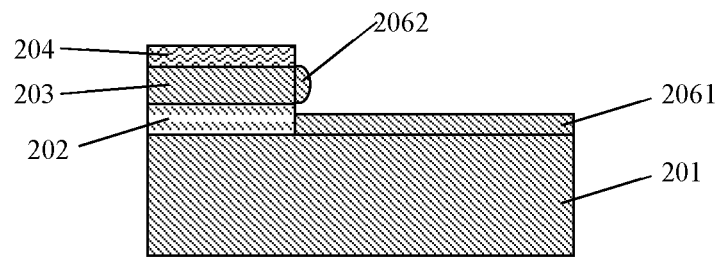
Figure 3D:
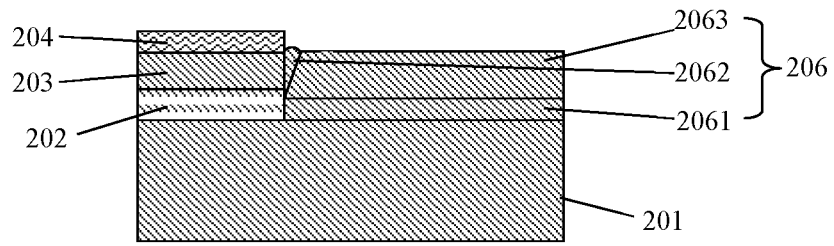
Figure 3E:
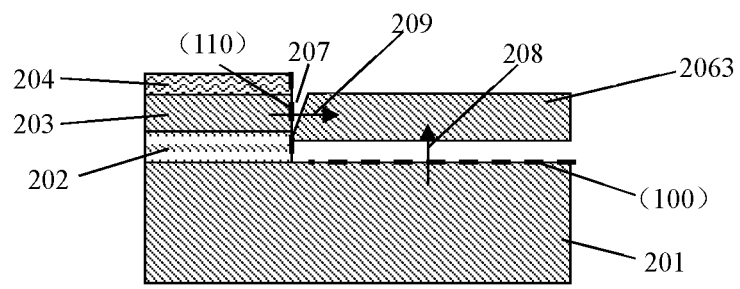

Referring also to FIG. 3E, the first crystalline face of the semiconductor lattice is (100), and the second crystalline face is (110).

Step 3. Referring to FIG. 3C, first epitaxial growth is performed, wherein the first epitaxial growth is isotropic epitaxial growth having the same growth rate of both the first plane and the second crystalline faces.

The first epitaxial growth forms a first semiconductor epitaxial sublayer 2061 on the second top surface of the semiconductor body layer 201, and a top surface of the first semiconductor epitaxial sublayer 2061 is located between the planes formed by a top surface and a bottom surface of the dielectric buried layer 202.

The first epitaxial growth forms the second semiconductor epitaxial sublayer 2062 on the side face of the semiconductor top layer 203 during the same period as the first epitaxial growth occurs, and the second semiconductor epitaxial sublayer 2062 forms a lateral protruding structure on the side face of the semiconductor top layer 203.

In the method according to this embodiment of the present application, the top surface of the first semiconductor epitaxial sublayer 2061 is flush with a surface at about two-thirds thickness of the dielectric buried layer 202.

Step 4. Referring to FIG. 3D, the second epitaxial growth is performed, wherein the second epitaxial growth is anisotropic epitaxial growth having a growth rate of the first crystalline face, herein the growth rate of the first crystalline face is greater than a growth rate of the second crystalline face.

The second epitaxial growth forms a third semiconductor epitaxial sublayer 2063 on the top surface of the first semiconductor epitaxial sublayer 2061, and a top surface of the third semiconductor epitaxial sublayer 2063 is flush with a top surface of the semiconductor top layer 203.

Using the characteristics of the growth rate of the second crystalline face being less than the growth rate of the first crystalline face, the third semiconductor epitaxial sublayer 2063 forms a chamfered recess 207 near the side face of the semiconductor top layer 203.

Referring to FIG. 3E, in order to describe the second epitaxial growth more clearly, the first semiconductor epitaxial sublayer 2061 and the second semiconductor epitaxial sublayer 2062 in FIG. 3D are not shown in FIG. 3E. It can be seen that an arrow line 208 represents a growth direction of the second epitaxial growth on the first crystalline face, an arrow line 209 represents a growth direction of the second epitaxial growth on the second crystalline face. A growth rate along the arrow line 208, i.e. the first crystalline face, is greater than a growth rate along the arrow line 209, i.e. the second crystalline face, ultimately forming the chamfered recess 207.

A semiconductor epitaxial layer 206 is formed by stacking the first semiconductor epitaxial sublayer 2061, the second semiconductor epitaxial sublayer 2062, and the third semiconductor epitaxial sublayer 2063, and positions of the lateral protruding structure and the chamfered recess 207 overlap, such that the semiconductor epitaxial layer 206 has a resultant flat surface at the corner the side surface of the semiconductor top layer 203.

The overlap of the lateral protruding structure and the chamfered recess 207 will result in that the lateral protruding structure 2062 is eventually ending in the chamfered recess 207, so little or none of any upper protruding structure will be formed. Even if there is a small upper protruding structure occurs, the flatness of the entire semiconductor epitaxial layer 206 is still largely improved and will satisfy very stringent process requirements.

A top surface of the semiconductor epitaxial layer 206 in the hybrid region can support a passive device or a pickup structure that needs to be connected to the semiconductor body layer 201.

The semiconductor top layer 203 outside the hybrid region can support a CMOS device.

The CMOS device includes a PMOS device and an NMOS device.

In the method according to this embodiment of the present application, the material of the semiconductor epitaxial layer 206 includes silicon or germanium. The materials of the first semiconductor epitaxial sublayer 2061, the second semiconductor epitaxial sublayer 2062, and the third semiconductor epitaxial sublayer 2063 are all the same.

An operating temperature of the second epitaxial growth is greater than an operating temperature of the first epitaxial growth.

An operating pressure of the second epitaxial growth is greater than an operating pressure of the first epitaxial growth. The operating pressure of the second epitaxial growth is applied in an epitaxial growth process cavity.

An etching gas ratio of the second epitaxial growth is greater than an etching gas ratio of the first epitaxial growth.

The ratio of the growth rate of the first crystalline face to the growth rate of the second crystalline face is a first growth rate ratio, the first growth rate ratio is adjusted by adjusting the temperature, pressure, or etching gas ratio of the second epitaxial growth, the first growth rate ratio is larger when the temperature of the second epitaxial growth is higher, the first growth rate ratio is larger when the pressure of the second epitaxial growth is higher, and the first growth rate ratio is larger when the etching gas ratio of the second epitaxial growth is higher. In the method according to this embodiment of the present application, by adjusting the temperature, pressure, and etching gas ratio of the second epitaxial growth and by configuring the top surface of the first semiconductor epitaxial sublayer 2061, the size of the chamfered recess 207 can be adjusted, the upper protruding structure can be minimized or fully eliminated under optimal conditions, and ultimately no protruding defect affecting product performance is formed.

Figure 4A:
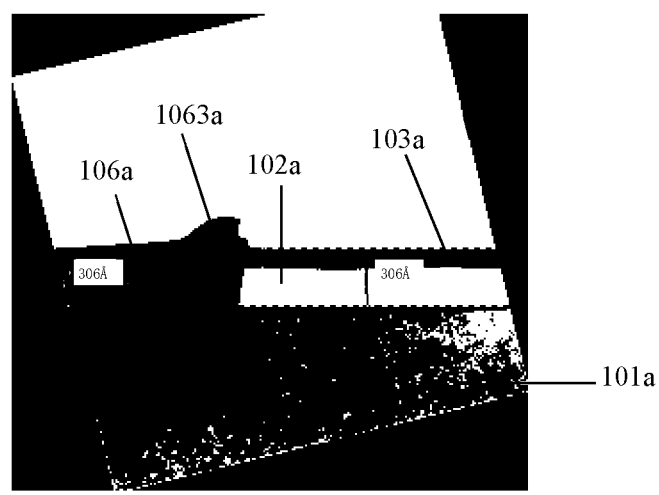
FIG. 4A is a cross sectional TEM image of the FDSOI hybrid region formed by the existing epitaxial growth method for an FDSOI hybrid region.

FIG. 4A is a cross sectional TEM image of the FDSOI hybrid region formed by the existing epitaxial growth method for an FDSOI hybrid region. The photograph is an electron microscope photograph. In FIG. 4A, the semiconductor body layer is represented by a mark 101a separately, the dielectric buried layer is represented by a mark 102a separately, the semiconductor top layer is represented by a mark 103a separately, the semiconductor epitaxial layer is represented by a mark 106a separately, and a protrusion defect is represented by a mark 1063a separately.

Figure 4B:
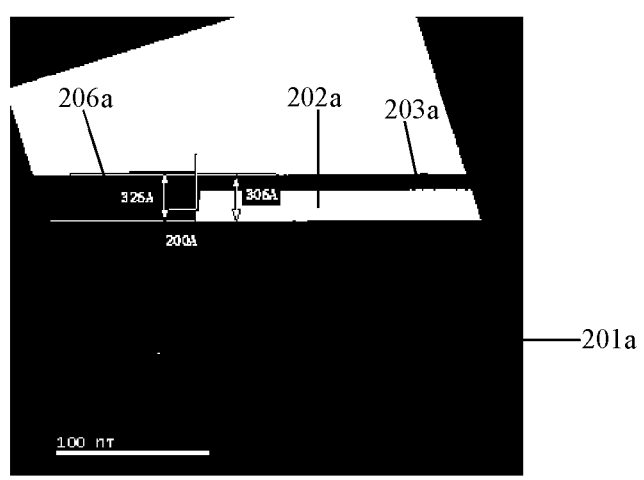
FIG. 4B is a cross sectional TEM image of the FDSOI hybrid region formed by the epitaxial growth method for an FDSOI hybrid region according to an embodiment of the present application.

FIG. 4B is a cross sectional TEM image of the FDSOI hybrid region formed by the epitaxial growth method for an FDSOI hybrid region according to this embodiment of the present application. In FIG. 4B, the semiconductor body layer is represented by a mark 201a separately, the dielectric buried layer is represented by a mark 202a separately, the semiconductor top layer is represented by a mark 203a separately, and the semiconductor epitaxial layer is represented by a mark 206a separately, and a protrusion defect. It can be seen that no protrusion defect is present in FIG. 4B.

In this embodiment of the present application, after the formation of the trench 205 of the hybrid region, using the characteristic of the second crystalline face on the side face of the semiconductor top layer 203 exposed from the side face of the trench 205 being different from the first crystalline face of the second top surface of the semiconductor body layer 201 exposed from the bottom surface of the trench 205, the formation of the semiconductor epitaxial layer 206 of the hybrid region is divided into two times of epitaxial growth. The first epitaxial growth is the same as epitaxial growth of the semiconductor epitaxial layer 206 of the hybrid region in the existing process. Although the second semiconductor epitaxial sublayer 2062 presenting the lateral protruding structure is also formed on the side face of the semiconductor top layer 203, this embodiment of the present application defines the thickness of the grown first semiconductor epitaxial sublayer 2061, such that the top surface of the first semiconductor epitaxial sublayer 2061 is located between the planes formed by the top surface and the bottom surface of the dielectric buried layer 202. Meanwhile, the second epitaxial growth is configured as an anisotropic epitaxial growth having the growth rate of the first crystalline face, wherein the growth rate of the first crystalline face is greater than the growth rate of the second crystalline face. In this way, the second epitaxial growth generates the chamfered recess 207 at the corner of the side face of the semiconductor top layer 203. After stacking all the semiconductor epitaxial sublayers together, the lateral protruding structure and chamfered recess 207 are located in the same region. As such, the lateral protruding structure desirably fills the chamfered recess 207, thus avoiding both a recess defect caused by the chamfered recess 207 and an upper protrusion defect generated by the lateral protruding structure. Finally, the semiconductor epitaxial layer 206 will end up with a flat surface on the side face of the semiconductor top layer 203, i.e. on the periphery of the hybrid region. Therefore, this embodiment of the present application can eliminate the protrusion defect in the semiconductor epitaxial layer 206 at the periphery of the hybrid region, thus improving the surface flatness of the semiconductor epitaxial layer 206 in the hybrid region.

The present application is described in detail above via specific embodiments, but these embodiments are not intended to limit the present application. Without departing from the principle of the present application, those skilled in the art can still make many variations and improvements, which should also be construed as falling into the protection scope of the present application.

What is claimed is:

1. A method for epitaxial growth in an FDSOI (fully depleted semiconductor on insulator), comprising:

step 1, providing an FDSOI substrate structure, wherein the FDSOI substrate structure comprises a hybrid region, wherein the hybrid region comprises a semiconductor body layer, a dielectric buried layer, and a semiconductor top layer; forming the dielectric buried layer on a surface of the semiconductor body layer, forming the semiconductor top layer on a surface of the dielectric buried layer; and forming a hard mask layer on a surface of the semiconductor top layer;

step 2, forming a trench in the hybrid region by removing portions of the hard mask layer, the semiconductor top layer, and the dielectric buried layer from a trench area, wherein a bottom surface of the trench is flush with or below a top surface of the semiconductor body layer, wherein the bottom surface of the trench exposes a portion of a surface of the semiconductor body layer, wherein the portion of the surface of the semiconductor body layer exposed by the bottom surface of the trench is a second top surface of the semiconductor body layer; wherein a side face of the trench exposes a side face of the hard mask layer, a side face of the semiconductor top layer, a side face of the dielectric buried layer, and a side face of the semiconductor body layer that are within a depth range of the trench;

wherein the second top surface of the semiconductor body layer comprises a first crystalline face of the semiconductor body layer, and wherein a side face of the semiconductor top layer comprises a second crystalline face of the semiconductor top layer;

step 3, performing a first epitaxial growth, wherein the first epitaxial growth is isotropic epitaxial growth, wherein the first crystalline face and the second crystalline face have a same growth rate;

forming a first semiconductor epitaxial sublayer on the second top surface of the semiconductor body layer, wherein a top surface of the first semiconductor epitaxial sublayer is located in a place between a top surface and a bottom surface of the dielectric buried layer; and wherein the first epitaxial growth forms a second semiconductor epitaxial sublayer on the side face of the semiconductor top layer during a same period as the first epitaxial growth occurs, wherein the second semiconductor epitaxial sublayer comprises a lateral protruding structure on the side face of the semiconductor top layer; and step 4, performing a second epitaxial growth, wherein the second epitaxial growth is an anisotropic epitaxial growth having a growth rate of the first crystalline face, wherein the growth rate of the first crystalline face is greater than a growth rate of the second crystalline face;

wherein the second epitaxial growth forms a third semiconductor epitaxial sublayer on the top surface of the first semiconductor epitaxial sublayer, wherein a top surface of the third semiconductor epitaxial sublayer is flush with a top surface of the semiconductor top layer; and wherein the third semiconductor epitaxial sublayer comprises a chamfered recess at the side face of the semiconductor top layer, as a result of the growth rate of the first crystalline face being faster than the growth rate of the second crystalline face;

and stacking the first semiconductor epitaxial sublayer, the second semiconductor epitaxial sublayer, and the third semiconductor epitaxial sublayer together to form a semiconductor epitaxial layer, wherein the lateral protruding structure and the chamfered recess overlap on the side face of the semiconductor top layer, such that the semiconductor epitaxial layer has a flat surface near a side surface of the semiconductor top layer.

2. The method for epitaxial growth in the FDSOI according to claim 1, wherein a material of the semiconductor body layer comprises silicon or germanium.

3. The method for epitaxial growth in the FDSOI according to claim 1, wherein a material of the dielectric buried layer comprises silicon oxide or a high dielectric-constant material.

4. The method for epitaxial growth in the FDSOI according to claim 1, wherein a material of the semiconductor top layer comprises silicon or germanium.

5. The method for epitaxial growth in the FDSOI according to claim 2, wherein a material of the semiconductor epitaxial layer comprises silicon or germanium.

6. The method for epitaxial growth in the FDSOI according to claim 1, wherein the hard mask layer is formed by stacking a first silicon oxide layer and a second silicon nitride layer.

7. The method for epitaxial growth in the FDSOI according to claim 1, wherein in step 2, the trench in the hybrid region is patterned by a lithography and an etch process, wherein the portions of the hard mask layer, the semiconductor top layer, and the dielectric buried layer are removed from the trench area, and wherein the semiconductor body layer is not etched.

8. The method for epitaxial growth in the FDSOI according to claim 1, wherein a thickness of the semiconductor top layer is less than 12 nm.

9. The method for epitaxial growth in the FDSOI according to claim 1, wherein the first crystalline face of the semiconductor body layer is (100), and the second crystalline face of the semiconductor top layer is (110).

10. The method for epitaxial growth in the FDSOI according to claim 9, wherein the top surface of the first semiconductor epitaxial sublayer is flush with a plane located at about two-thirds of a thickness of the dielectric buried layer.

11. The method for epitaxial growth in the FDSOI according to claim 10, wherein an operating temperature of the second epitaxial growth is higher than an operating temperature of the first epitaxial growth;

an operating pressure of the second epitaxial growth is higher than an operating pressure of the first epitaxial growth; and an etching gas ratio of the second epitaxial growth is greater than an etching gas ratio of the first epitaxial growth.

12. The method for epitaxial growth in the FDSOI according to claim 11, wherein in step 4, a first growth rate ratio of the growth rate of the first crystalline face to the growth rate of the second crystalline face is optimized by adjusting the operating temperature, the operating pressure, or the etching gas ratio of the second epitaxial growth; and wherein the first growth rate ratio increases if any one of the operating temperature, the operating pressure, and the etching gas ratio of the second epitaxial growth increases.

13. The method for epitaxial growth in the FDSOI according to claim 1, wherein a surface of the semiconductor epitaxial layer in the hybrid region supports a passive device or a pickup structure that needs to be connected to the semiconductor body layer.

14. The method for epitaxial growth in the FDSOI according to claim 1, wherein the semiconductor top layer outside the hybrid region supports a CMOS device.

15. The method for epitaxial growth in the FDSOI according to claim 14, wherein the CMOS device comprises a PMOS device and an NMOS device.

* * * * *